United States Patent
Kraenert et al.

[11] Patent Number: 5,838,712
[45] Date of Patent: Nov. 17, 1998

[54] DIODE-PUMPED HIGH PERFORMANCE SOLID STATE LASER

[75] Inventors: Juergen Kraenert; Holger Kuehn; Holger Mueller, all of Jena; Siegfried Kufert, Kahla, all of Germany

[73] Assignee: JENOPTIK Aktiengesellschaft, Jena, Germany

[21] Appl. No.: 750,691

[22] PCT Filed: Mar. 18, 1996

[86] PCT No.: PCT/EP96/01151

§ 371 Date: Dec. 18, 1996

§ 102(e) Date: Dec. 18, 1996

[87] PCT Pub. No.: WO96/34435

PCT Pub. Date: Oct. 31, 1996

[30] Foreign Application Priority Data

Apr. 28, 1995 [DE] Germany ................ 195 15 635.8

[51] Int. Cl.$^6$ .............................. H01S 3/09; H01S 3/091
[52] U.S. Cl. .................................................. 372/75
[58] Field of Search .................... 372/29, 34, 40, 372/75

[56] References Cited

U.S. PATENT DOCUMENTS 4,969,155  11/1990  Kanan .

FOREIGN PATENT DOCUMENTS

| 0 377 206 | 7/1990 | European Pat. Off. . |
| 0 377 207 | 7/1990 | European Pat. Off. . |
| 2 675 960 | 10/1992 | France . |
| 39 14 492 | 11/1990 | Germany . |

OTHER PUBLICATIONS

Applied Optics, 20 Sep. 1994, vol. 33 No. 27 "23–W Average Power at 0.537 $\mu$m from an Externally Frequency–Doubles Q–Switched Diode–Pumped Nd:YOS Laser Oscillator" Comaskey, et al.

IEEE Journal of Quantum Electronics, 28 Apr. 1992, No. 4 "High Average Power Diode Pumped Slab Laser" Comaskey, et al.

Primary Examiner—Rodney B. Bovernick
Assistant Examiner—Robert E. Wise
Attorney, Agent, or Firm—McAulay Nissen Goldberg Kiel & Hand, LLP

[57] ABSTRACT

A diode-pumped high performance solid state laser has at least one pump module comprising at least two laser diode arrays which transversely irradiate a solid state laser rod. The path length of the radiation emitted by a laser diode array through the solid state laser rod and the required absorption path for this radiation, determined by the emission wavelength of this radiation and the doping of the laser-active medium, are adapted to one another extensively in different ways.

11 Claims, 1 Drawing Sheet

DIODE-PUMPED HIGH PERFORMANCE SOLID STATE LASER

BACKGROUND OF THE INVENTION a) Field of the Invention

The invention is directed to a diode-pumped high performance solid state laser. An arrangement of this kind is known in a very broad sense from U.S. Pat. No. 4,945,544.

b) Description of the Related Art

In general, solid state lasers are excited to laser activity by supplying optical energy ("optical pumping"). The sources of this energy are conventional krypton lamps or xenon lamps and, recently, semiconductor diodes emitting in the near infrared range.

Semiconductor lasers are virtually ideal light sources for the optical excitation of solid state lasers. In comparison with conventional lamps, they are characterized especially by a good spectral adaptation of the pumping radiation to the absorption bands of the laser-active crystal and by a long lifetime and they enable the development of compact, efficient laser systems which are constructed only from solid state materials and which are distinguished by small dimensions and high efficiency. At present, the so-called longitudinal and transverse pumps of generally cylindrical media represent the state of the art. The most efficient laser systems can be realized with longitudinal pump geometry. Thus, along with favorable tuning of the laser diode radiation to an absorption band of the solid state laser material, systems can be developed in which the ratio between optical pump output and optical output power is greater than 50%. The output power of these systems is limited on the one hand by the lack of an available semiconductor laser which has a sufficiently high output power and a small emitting aperture at the same time and on the other hand by the limited ability of the laser diode crystals to withstand thermal loading. Higher output powers can be realized only with transverse pump geometry which makes it possible for light from a plurality of laser diodes or laser diode arrays to be coupled into the laser medium.

Arrangements conceived in this way may basically be divided into direct transverse arrangements and indirect transverse arrangements. Due to the direct irradiation of the laser medium, direct transverse arrangements have the advantage of a highly efficient, low-loss pumped light transmission into the laser medium with a comparatively minor expenditure on adjustment. Strict limits are imposed on the quantity of laser diode arrays that can be arranged around the laser medium and with respect to minimizing the cross section of the laser medium, since the diodes must be arranged as near as possible in front of the laser medium because of their high divergence.

In the case of indirect transverse arrangements, the sharply divergent beam bundles of the emission radiation are shaped into parallel or convergent beam bundles via coupling optical elements. Accordingly, a greater distance from the laser medium can be selected. As a result of the saved space, a much larger quantity of diode arrays can be arranged around the laser medium. In addition to the high expenditure on adjustment and the resulting stability problems, the compactness of such arrangements is also reduced.

A number of requirements must be met in order to achieve a high performance laser with high efficiency and favorable beam product. These requirements are met in different ways and to varying degrees by the solutions known from the prior art. Ultimately, every solution represents a compromise since, on the one hand, the requirements are contradictory in part and, on the other hand, there is naturally a permanent requirement for maintenance-free systems with long-term stability at minimum effort in terms of design and cost.

A chief requirement stems from the temperature dependency (approximately 0.25 nm/°C.) of the laser diodes, on which basis the emission wavelength can be precisely tuned to an absorption band of the solid state laser material. The extremely narrow half-width of the excitation band which is generally less than 1 nm leads to the compulsory requirement for a necessary temperature stabilization. If the pump arrangement comprises a plurality of diode arrays, they must be temperature-stabilized individually in order to adapt all of them exactly to the absorption bands, since their emission wavelengths vary as a result of the manufacturing process. The plurality of required feed lines and outlet lines for the coolant make such arrangements expensive and prone to disturbance so that, as a rule, a certain wavelength drift between the emission wavelengths must be tolerated and all laser diode arrays to be arranged in a plane must be mounted on a common cooling body. Arrangements of this kind are known, e.g., from U.S. Pat. No. 4,719,631, U.S. Pat. No. 5,084,886 and DE 39 14 492 A1. The authors of these references do not address the resulting disadvantage that the required absorption path increases exponentially with the drift of the emission wavelength from the absorption bands of the laser medium. In practice, for solutions in which absorption is to be effected with the one-time passage through the laser medium, this means that either high energy losses must be tolerated or the diameter of the laser medium is enlarged such that even the emission wavelength having a large drift and requiring the longest absorption path is completely absorbed. However, the latter step conflicts with a second requirement for achieving a good inversion and accordingly a good effectiveness of the laser, i.e., to keep the excited volume as low as possible in order to achieve a high energy density.

In U.S. Pat. No. 4,945,544, the indirect transverse pumping of a laser rod with laser diodes is claimed per se. A cylindrical lens is so arranged upstream of a plurality of laser diodes arranged parallel to the axis of the laser rod that the emission radiation of the laser diodes is focused on the axis of the laser rod. In this case, regardless of the temperature dependency, it is assumed that all diodes emit the same wavelength coinciding with the absorption bands of the laser medium, which is not applicable in practice. Regardless of this, although a high energy density is achieved in the region of the axis of the laser rod, the final third requirement for high efficiency, the most homogeneous possible distribution of the energy density in the laser medium, is not met. This is also true of the solution disclosed in U.S. Pat. No. 4,756,002. In the interest of a less costly temperature stabilization, the pumping radiation passes through the laser medium repeatedly by means of multiple reflection in order to lengthen the possible path for absorption and accordingly to achieve complete absorption. Regions of very different energy densities necessarily result in the laser medium. In the prior art, no consideration is paid to the fact that adjustment effort increases as the quantity of laser diode arrays arranged around and along the laser medium increases.

OBJECT AND SUMMARY OF THE INVENTION

The object of the present invention is to develop a diode-pumped high performance solid state laser which is characterized by compactness and high efficiency.

In accordance with the invention, in a diode-pumped high performance solid state laser having a solid state laser rod, at least one pump module which is arranged parallel to the axis of the solid state laser rod and which comprises at least two temperature-stabilized laser diode array 5 and coupling optics which are arranged between the pump module and solid state laser rod, the improvement comprising laser diode arrays of a pump module which are arranged in order of decreasing emission wavelength with reference to the identical operating temperature; the first laser diode array of each pump module being stabilized at the temperature at which the emission wavelength corresponds most closely to the absorption bands of the laser active medium; the path length of the radiation emitted in each instance through the solid state laser rod by a laser diode array and the required absorption path for the radiation, determined by the emission wavelength of the radiation and the doping of the laser-active medium, being substantially adapted to one another.

The basic idea of the invention consists in that the path length of the radiation emitted by a laser diode array through the solid state laser rod and the required absorption path for this radiation determined by the emission wavelength of this radiation and the doping of the laser-active medium are adapted to one another to a great extent. In this way it is possible to achieve the highest possible absorption with the smallest possible cross section of the laser rod and accordingly high energy density which is distributed as homogeneously as possible, A compulsory prerequisite for achieving the tuning according to the invention consists in the selection and arrangement of the laser diode arrays corresponding to their emission wavelength at the same operating temperature. The laser diode arrays are arranged within a pump module in order of decreasing emission wavelength with reference to the identical operating temperature, wherein at least the laser diode array with the greatest wavelength is stabilized at the temperature at which the emission wavelength corresponds to the absorption bands of the laser-active medium.

The temperature stabilization of the subsequent laser diode arrays can be effected, e.g., by arranging on a common cooling body, at the same temperature or can be advantageously graduated at slightly higher temperatures so that the drift of the emission wavelength of the radiation of the individual diode arrays for the absorption bands of the laser-active medium and accordingly the difference of the required absorption path are reduced. The absorption paths can also be advantageously reduced for the radiation of increasing drift in that the active laser medium in the radiation range of the laser diode arrays with drift is doped to a correspondingly greater extent.

The tuning according to the invention can be effected not only by the aforementioned reduction of the absorption path, but also by varying the path length of the radiation of the individual laser diode arrays through the solid state laser rod. Different wavelengths can be achieved by variations in the cross section of the laser rod, which advantageously has a conical shape, or by means of deliberately different beam deflection such that the radiation with a greater required absorption path penetrates the solid state laser rod in the central region, while the radiation with a shorter required absorption path, namely with only minor drift, if any, also penetrates the edge regions of the solid state laser rod so that the mean path length of such a beam bundle is less than the mean path length of a beam bundle penetrating the central region of the solid state laser rod. The beam deflection of the beam bundles can also be effected by different intersection lengths, a different refractive index in the respective penetrated region of the coupling optical elements, or by different diameters of the coupling optical elements in the penetrated regions, e.g., by using a conical lens. It is also possible to use a gradient lens or even a diffractive optical element instead of a cylindrical or conical lens.

In an advantageous construction of the diode-pumped high performance solid state laser according to the invention, an uneven number of laser diode arrays are arranged so as to be uniformly distributed around the solid state laser rod. A cooling pipe enclosing the solid state laser rod is given a reflective surface in each instance in the regions located opposite to the laser diode arrays so that the radiation which is not fully absorbed during the first penetration of the solid state laser rod is reflected back and penetrates the solid state laser rod a second time.

The invention is explained more fully in the following with reference to an embodiment example shown in the drawing.

DESCRIPTION OF THE PREFERRED EMBODIMENTS

Figure 1:
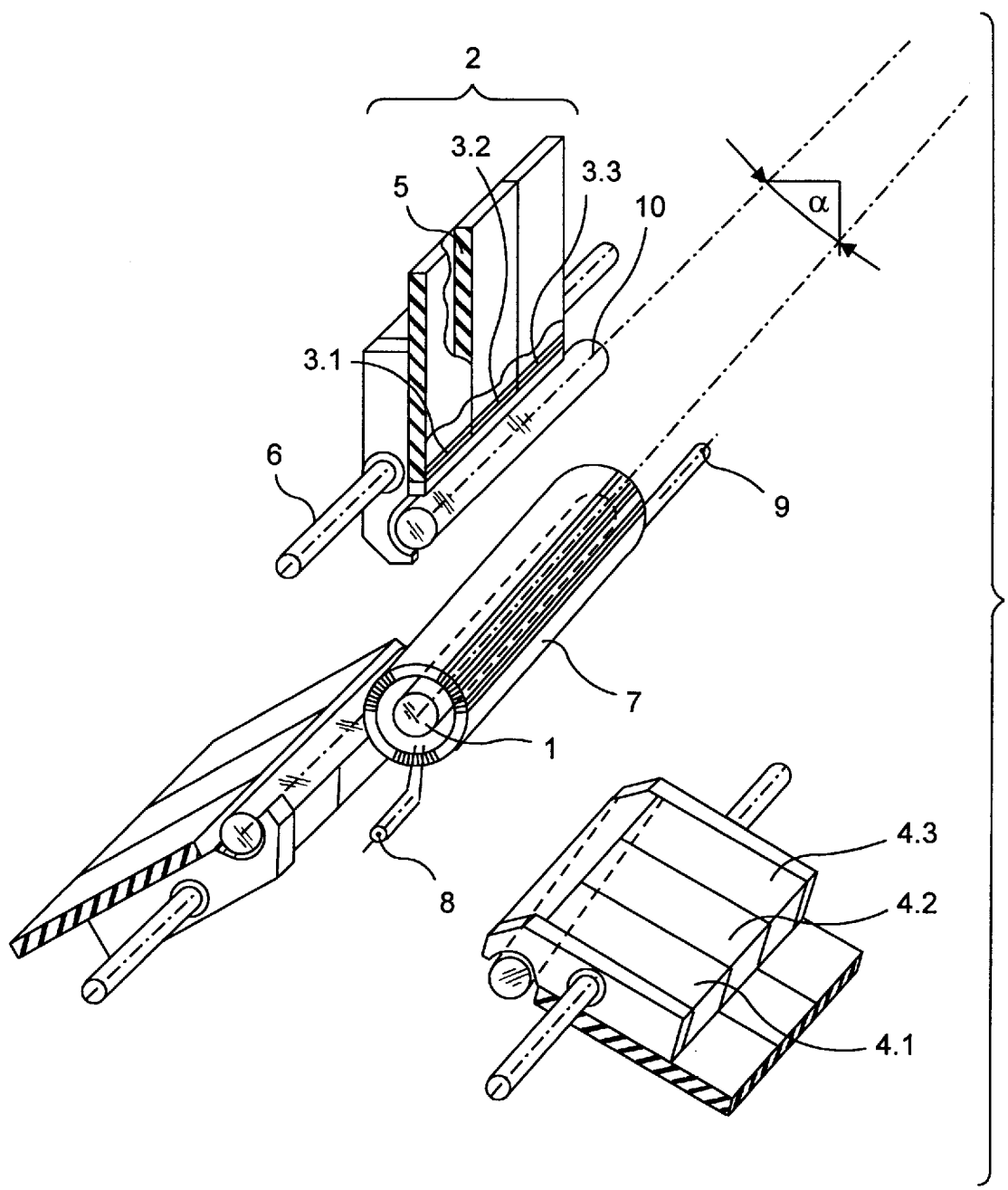
FIG. 1 is an exploded view showing the basic construction of a diode-pumped high performance laser, according to the invention, with three pump modules.

In the embodiment example shown in FIG. 1, three pump modules 2 are arranged around the solid state laser rod 1 which, in this case, is a cylindrical Nd:YAG rod with uniform doping. The pump modules 2 are identically constructed and in each instance comprise three laser diode arrays 3.1; 3.2; 3.3 which are arranged in a row parallel to the axis of the solid state laser rod 1 on a cooling body 4 in each instance. The cooling bodies 4.1; 4.2; 4.3 are insulated thermally and electrically relative to one another by means of an insulating foil 5 which is inserted between cooling bodies 4.1 and 4.2 and cooling bodies 4.2 and 4.3. A thermal connection between the cooling bodies 4.1; 4.2; 4.3 is effected via a cooling pipe 6 which is guided through the cooling bodies 4.1; 4.2; 4.3 parallel to the axis of the solid state laser rod 1. The supply of coolant is effected via cooling body 4.1. Accordingly, cooling body 4.1 is cooled the most and cooling body 4.3 is cooled the least as a result of the increasing warming of the coolant. Thus, there results a slight difference in temperature between cooling bodies 4.1 and 4.2 and between cooling bodies 4.2 and 4.3 and accordingly a slight difference between the operating temperatures of the individual laser diode arrays 3.1; 3.2; 3.3. The cooling pipes 6 of the three pump modules 2 are connected on the input side via a first compensation chamber, not shown, with the coolant input 8 of a cooling cylinder 7 surrounding the solid state laser rod 1 and with a coolant feed, also not shown, so that the individual pump modules 2 are cooled on the average to the same temperature and a pressure compensation takes place. On the output side, the cooling pipes 6 of the three pump modules 2 are connected, via a second compensation chamber, not shown, with the coolant output 9 of the cooling cylinder 7 and a coolant outlet line, also not shown. All laser diode arrays 3 required for the entire arrangement are preselected in such a way that their emission wavelengths differ from one another as little as possible at the same operating temperature.

Of the nine selected laser diode arrays 3, the three with the greatest emission wavelength are arranged on the input side of the cooling pipes 6 so that the latter are cooled to the same temperature. The coolant temperature is so selected that these three laser diode arrays 3.1 have an emission wavelength which coincides with the absorption bands of the active laser medium of the solid state laser rod 1. The laser diode arrays 3.2 and 3.3 are arranged in order of decreasing wavelength and accordingly in order of increasing drift from the absorption bands. As a result of the cooling described above, the drift is less pronounced than it would be if the laser diode arrays 3.2 and 3.3 were cooled to the same temperature as the laser diode arrays 3.1. This causes a reduction in the difference of the absorption paths required for the absorption of the radiation of the individual laser diode arrays.

Another effect for increasing the efficiency of the embodiment example is achieved by means of the arrangement, according to the invention, of coupling optics 10, in this case cylindrical lenses. The axes of the coupling optical elements 10 are tilted relative to the axis of the solid state laser rod 1 in the direction of the pump modules 2 by an angle α. In this way a different intersection length $S_1$, $S_2$ and $S_3$ results for the laser diode arrays 3.1, 3.2 and 3.3, where $S_1 > S_2 > S_3$. The beam bundles of the laser diode arrays 3.1, 3.2 and 3.3 therefore take different paths through the solid state laser rod 1 after different beam shaping by means of the coupling optical elements 10. The radiation not absorbed during the first pass through the solid state laser rod 1 strikes the circumference of the cooling cylinder 7. This cooling cylinder 7 is provided with a reflective surface in the regions located opposite to the laser diode arrays 3 so that the radiation which is not absorbed is reflected back into the solid state laser rod 1.

While the foregoing description and drawings represent the present invention, it will be obvious to those skilled in the art that various changes may be made therein without departing from the true spirit and scope of the present invention.

What is claimed is:

1. In a diode-pumped high performance solid state laser having a solid state laser rod, at least one pump module which is arranged parallel to the axis of the solid state laser rod and which comprises at least two temperature-stabilized laser diode arrays and coupling optics which are arranged between the pump module and solid state laser rod, the improvement comprising: laser diode arrays of a pump module being arranged in order of decreasing emission wavelength with reference to the identical operating temperature;

said first laser diode array of each pump module being stabilized at the temperature at which the emission wavelength corresponds most closely to the absorption bands of the laser-active medium; and the path length of the radiation emitted in each instance through the solid state laser rod by a laser diode array and the required absorption path for the radiation, determined by the emission wavelength of the radiation and the doping of the laser-active medium, being substantially adapted to one another.

2. The diode-pumped high performance solid state laser according to claim 1, wherein in for the purpose of temperature stabilization of the laser diode arrays of a respective pump module, the laser diode arrays are arranged on a separate cooling body, wherein the only thermal contact between the cooling bodies is effected via a cooling pipe which is guided through the cooling body and in which a coolant flows in the direction of the laser diode arrays arranged in order of decreasing wavelength, and the coolant, upon entering the cooling pipe, has the temperature at which the laser diode array which is first in sequence has an emission wavelength identical as far as possible to the absorption bands of the laser-active medium.

3. The diode-pumped high performance solid state laser according to claim 2, wherein the cooling pipe is arranged parallel to the axis of the solid state laser rod and ends thereof serve as bearing journals for the purpose of adjusting the pump module around the axis of the cooling pipe.

4. The diode-pumped high performance solid state laser according to claim 2, wherein an uneven number of pump modules are arranged at uniform intervals around the solid state laser rod and the solid state laser rod is enclosed coaxially by a cooling cylinder with a cooling input and a cooling output which is provided with a reflective surface in the regions located opposite to the laser diode arrays, wherein the cooling pipe is arranged parallel to the axis of the solid state laser and ends thereof serve as bearing journals for the purpose of adjusting the pump module around the axis of the cooling pipe and wherein the cooling pipes of the pump modules are connected with the coolant inlet of the cooling cylinder and a coolant feed via a first compensation chamber and with the coolant outlet and a coolant outlet line via a second compensation chamber.

5. The diode-pumped high performance solid state laser according to claim 1, wherein the coupling optics comprise a cylindrical lens which is so arranged in front of the laser diode arrays of a pump module that its distance to the laser diode arrays arranged in the direction of decreasing wavelength decreases so that the intersection length is increasingly smaller and the bundle cross section of the radiation of the individual diode arrays is accordingly reduced.

6. The diode-pumped high performance solid state laser according to claim 1, wherein in that the coupling optics comprise a cylindrical lens whose refractive index decreases in the direction of the laser diode arrays which are arranged in order of decreasing wavelength.

7. The diode-pumped high performance solid state laser according to claim 1, wherein the coupling optics comprise a conical lens whose diameter increases in the direction of the laser diode arrays which are arranged in order of decreasing wavelength.

8. The diode-pumped high performance solid state laser according to claim 1, wherein the solid state laser rod is a conical rod whose diameter increases in the direction of the laser diode arrays which are arranged in order of decreasing wavelength.

9. The diode-pumped high performance solid state laser according to claim 1, wherein the solid state laser rod is formed of a laser-active medium whose doping increases in the direction of the laser diode arrays which are arranged in order of decreasing wavelength.

10. The diode-pumped high performance solid state laser according to claim 1, wherein an uneven number of pump modules are arranged at uniform intervals around the solid state laser rod and the solid state laser rod is enclosed coaxially by a cooling cylinder with a cooling input and a cooling output which is provided with a reflective surface in the regions located opposite to the laser diode arrays.

11. The diode-pumped high performance solid state laser according to claim 1, wherein in that there are at least two pump modules.

* * * * *